United States Patent [19]

Klein et al.

[11] 4,097,308
[45] Jun. 27, 1978

[54] GLASS ENCLOSED SOLAR CELL PANEL

[75] Inventors: William Richard Klein; Carl Leroy Kotila; Ira Leslie Krams, all of Houston, Tex.

[73] Assignee: Tideland Signal Corporation, Houston, Tex.

[21] Appl. No.: 825,312

[22] Filed: Aug. 17, 1977

[30] Foreign Application Priority Data

Apr. 28, 1977 United Kingdom .............. 17893/77

[51] Int. Cl.² ........................................... H01L 31/04
[52] U.S. Cl. ................................ 136/89 H; 136/89 P; 206/0.82; 206/0.83; 206/0.84; 206/328; 206/445; 206/486
[58] Field of Search ............. 136/89 P, 89 PC, 89 H; 250/239; 206/0.83, 0.82, 0.84, 45.34, 328, 332, 333, 445, 486

[56] References Cited

U.S. PATENT DOCUMENTS

| 2,296,670 | 9/1942 | Hewlett | 136/89 |
|---|---|---|---|
| 2,823,245 | 2/1958 | Solow | 136/89 |
| 2,919,353 | 12/1959 | Paradise | 250/239 |
| 2,946,945 | 7/1960 | Regnier et al. | 320/2 |
| 3,145,833 | 8/1964 | Muller | 206/83 |
| 3,376,164 | 4/1968 | Bachwansky | 136/89 |
| 3,957,537 | 5/1976 | Baskett et al. | 136/89 |
| 3,982,963 | 9/1976 | Mahoney et al. | 136/89 |
| 4,009,054 | 2/1977 | Gochermann et al. | 136/89 P |

Primary Examiner—Aaron Weisstuch
Attorney, Agent, or Firm—Fulbright & Jaworski

[57] ABSTRACT

A solar panel for use in hostile environments. The panel includes top and bottom molded glass plates, each having a downwardly directed sidewall extending around their outer peripheries. The bottom plate is positioned beneath and within the sidewalls of the top plate thereby downwardly directing the opening to the compartment formed between the top and bottom plates. Recesses are molded in either the bottom of the top plate or in the top of the bottom plate for receiving solar cells whereby the thickness of the compartment is minimized. The recesses are sized and shaped to conform to the size and shape of the solar cells. A passageway is provided from each recess to an adjacent recess for electrical connections between adjacent solar cells which are positioned in each of the recesses. Potting compound having an index of refraction similar to the index of refraction of glass fills the compartment. The thickness of the compartment is sufficient to allow the compound to withstand thermal cycling. Electrical connections to the solar cells sealably extend through the bottom plate.

12 Claims, 6 Drawing Figures

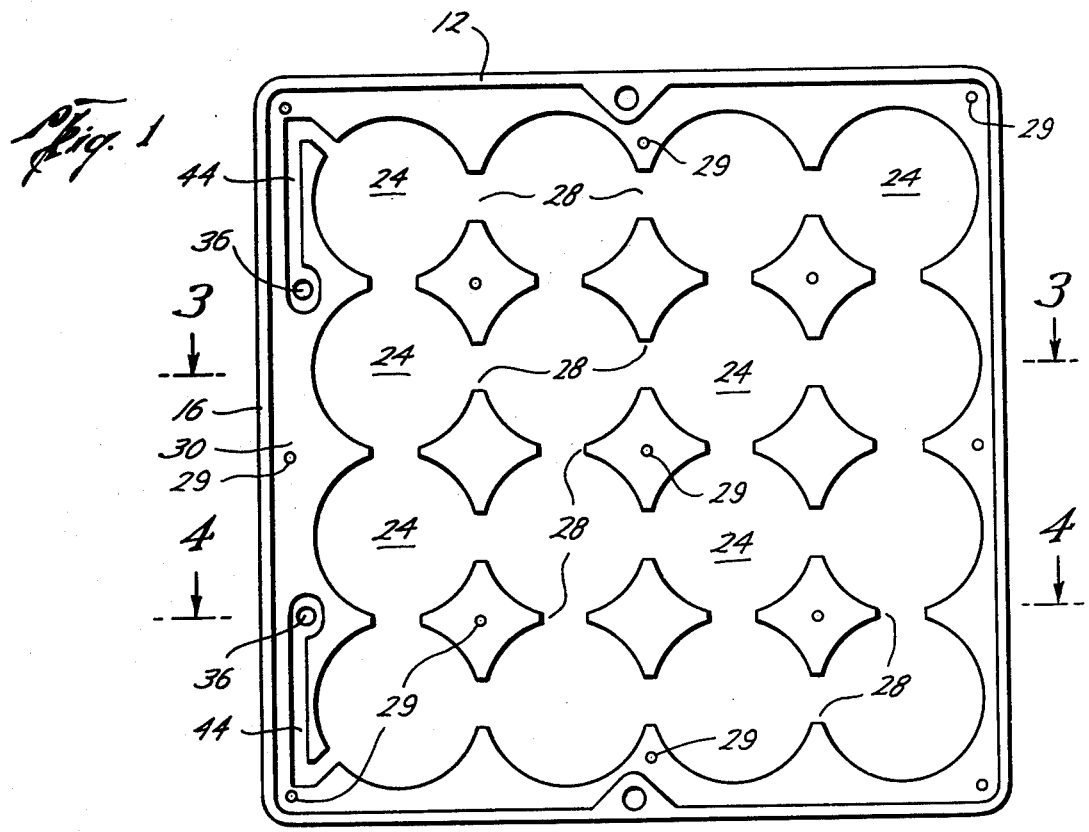
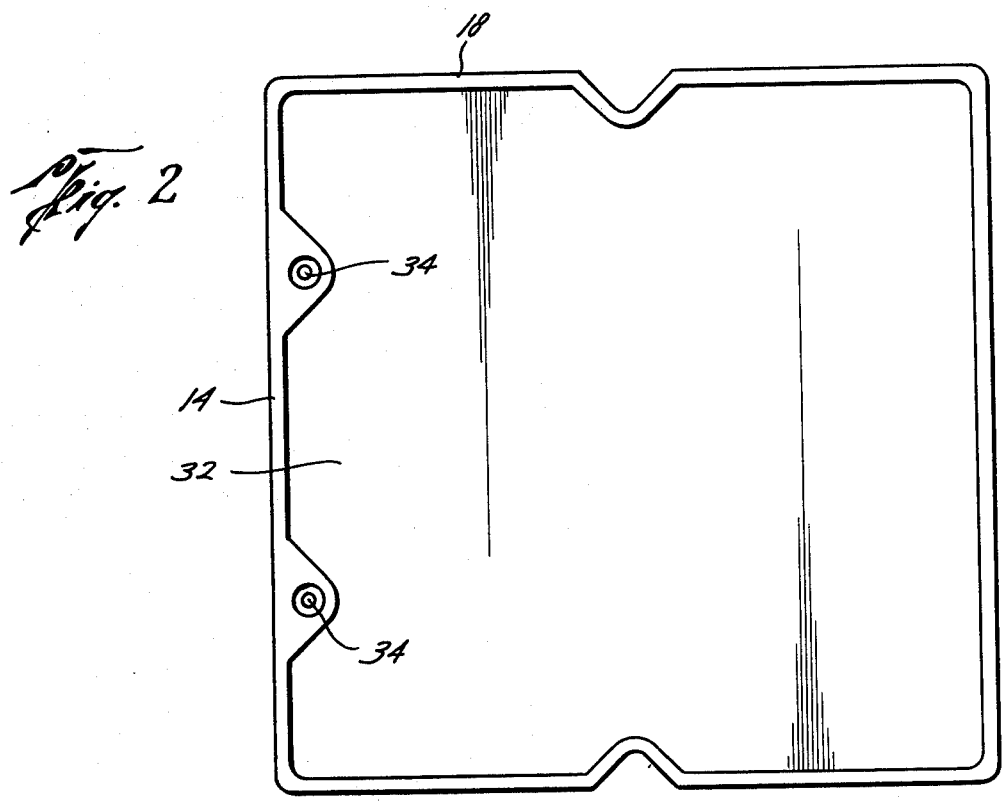

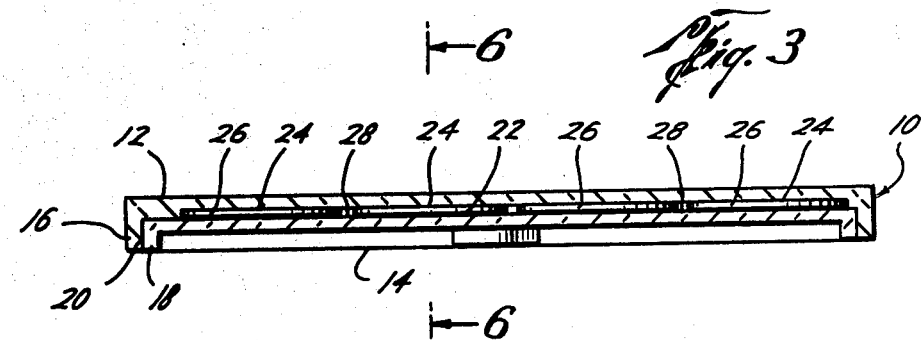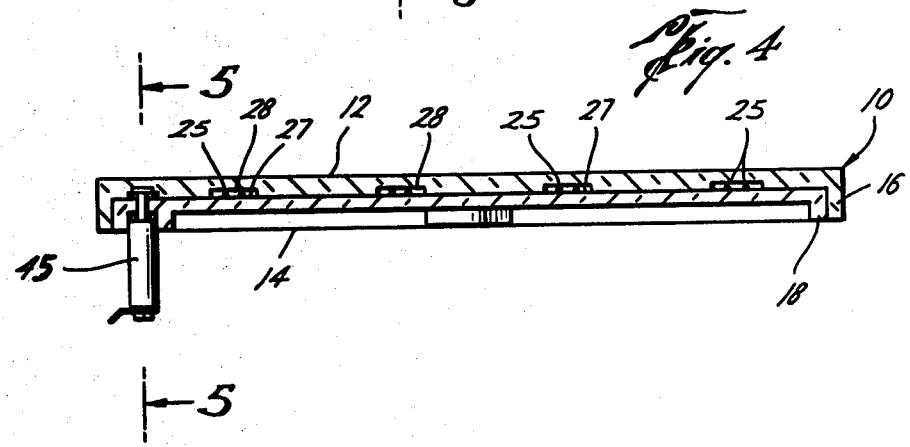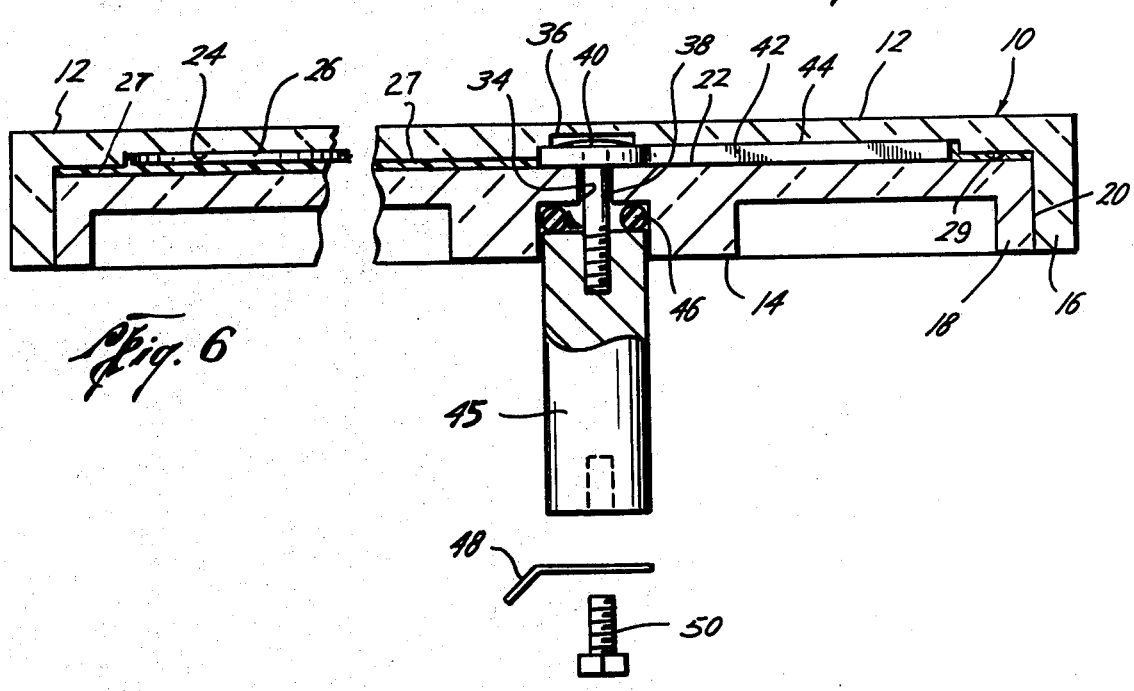

GLASS ENCLOSED SOLAR CELL PANEL

BACKGROUND OF THE INVENTION

In the past, solar cell panels have been generally satisfactory in clean environments such as in outer space, desert areas, and at high elevations. However, in other environments, and in particular for marine uses, solar panels have had an unexpectedly short life when they have encountered typical degrading conditions including humidity, salt water, atmospheric pollutants, chemical agents, muds, sulphur compounds, bird droppings, degrading sunlight (both ultraviolet and infrared) and extreme temperature changes. While the partial use of glass has been suggested in U.S. Pat. Nos. 2,946,945 and 2,823,245, the more modern tendency has been to utilize various plastic materials to enclose the solar cells. However, the various types of solar packages in use have been generally unsuccessful when subjected to adverse conditions, such as marine use, because of various modes of degradation. The most common mode of failure is the separation occurring between the various layers of the solar panel resulting in excessive light reflection with a consequent reduction of electrical output and eventual failure of the electrical connections between photo-voltaic cells. Failures have been most often due to failure of the panel enclosure rather than failure of the cells and is caused by the above-mentioned degrading agents encountered in hostile environments.

The present invention is directed to providing a solar cell panel with a package suitable for use in extremely hostile environments.

SUMMARY

The present invention is directed to a solar cell panel having a top and bottom molded glass plate. The glass plates are advantageous in that (1) they are relatively impermeable to degrading agents, (2) their lack of ultraviolet degradation (3) the glass top cover reduces transmission of degrading ultraviolet radiations which attack potting compounds, (4) glass and the commonly used solar photo-voltaic cell materials have a similar thermal expansion property thereby minimizing mechanical stresses, (5) the bottom glass plate permits transmission of unused infrared radiation through the panel resulting in a cooler, more efficient panel, (6) the chemically inert properties of glass gives stability in the presence of corrosive organic and inorganic agents, (7) the surfaces of the glass are easily washed by rain and (8) undesirable coatings are easily removed from the glass plates.

Another object of the present invention is the provision of a solar cell panel having top and bottom molded glass plates in which each of the plates has a downwardly directed sidewall extendng around its outer periphery in which the bottom plate is positioned beneath and within the sidewall of the top plate thereby directing the opening to the compartment formed between the top and bottom plates in a downward direction to avoid direct exposure to rain, splash from the sea, and spindrift.

Still another object of the present invention is the provision of recesses molded in either the bottom of the top plate or the top of the bottom plate for receiving solar cells whereby the thickness of the compartment is minimized. Solar cells are positioned in each of the recesses and a potting compound having an index of refraction similar to the index of refraction of glass fills the compartment. The provision of the recesses provides the following advantages: (1) uniform thickness of the embedding compound resulting in more uniform stresses, (2) reduction of potting compound volume wtih consequent cost savings, (3) reduction in the thickness of the potting compound thereby overcoming the problem of thermal expansion of the potting compound, and (4) floating of the solar cells in the potting compound reducing point contact stresses. However, the thickness of the compartment is made sufficient to allow the potting compound to withstand temperature changes.

Still a further object of the present invention is the provision of a solar cell panel in which the interior surfaces of the top and bottom glass plates are texturized for increasing the adhesion of the potting compound to the glass plates by increasing the effective bonding area.

Still a further object of the present invention is the provision of providing a passageway from each recess to an adjacent recess for accommodating the electrical connections between adjacent solar cells and floating the entire solar cells and electrical connections in the potting compound.

Yet a still further object of the present invention is the provision of providing electrical connections to the solar cells which sealably extend downwardly through the bottom plate. The electrical connections include an extended interior path leading to one of the recesses with a stud extending from the path through the bottom plate, a lug positioned in the path and soldered to the stud with the lug electrically connected to a solar cell and a sealing material filling the path. The electrical connections provide a slack connecting conductor permitting strain relief for the fragile solar cells, provide a strong mechanical terminal, and are directed downwardly and sealed to prevent the entry of adverse environmental agents.

Other and further features and advantages will be readily apparent from the following description of a preferred embodiment.

DESCRIPTION OF THE DRAWINGS

FIG. 1 is an elevational view of the bottom of the top plate of the solar cell panel of the present invention, FIG. 2 is an elevational view of the top of the bottom plate of the solar cell panel of the present invention, FIG. 3 is a cross-sectional view taken along the line 3—3 of FIG. 1 with the solar cell panel in the assembled position, FIG. 4 is a cross-sectional view taken along the line 4—4 of FIG. 1 of the solar cell panel in the assembled position, FIG. 5 is an enlarged fragmentary cross-sectional view taken along the line 5—5 of FIG. 5, and FIG. 6 is an enlarged fragmentary cross-sectional view taken along the line 6—6 of FIG. 3.

DESCRIPTION OF THE PREFERRED EMBODIMENT

Referring to FIG. 3 of the drawings, the numeral 10 generally indicates the solar cell panel of the present invention which is a solar photo-voltaic energy converter which, while having many uses, is particularly useful for charging a battery system during daylight hours for operating marine aids to navigation. The panel 10 includes a top 12 and a bottom 14. Each of the top 12 and the bottom 14 is a molded glass plate. The glass components are particularly advantageous in that (1) they are relatively impermeable, particularly as compared to plastics, (2) they do not suffer from ultraviolet degradation, (3) the top glass plate reduces transmission of degrading ultraviolet radiation which attacks potting compounds, (4) both glass and the commonly used photo-voltaic cell materials have a similar thermal expansion thereby minimizing mechanical stresses, (5) the bottom glass plate permits transmission of unused infrared radiation through the panel 10 resulting in a cooler, more efficient panel, (6) the chemically-inert properties of glass provide stability in the presence of corrosive organic and inorganic agents, (7) the outer surfaces of the plates 12 and 14 are easily washed by rain, and (8) undesirable coatings are easily removed from the surfaces of the glass plates 12 and 14.

The top plate 12 is molded in one piece with a downwardly directed sidewall 16 extending around the outer periphery of the plate 12. Similarly, the bottom plate 14 is a one-piece molded glass plate having a downwardly directed sidewall 18 extending around the outer periphery of the bottom plate 14. When the top plate 12 and the bottom plate 14 are assembled, as best seen in FIGS. 3–5, the bottom plate is positioned beneath and within the sidewall 16 of the top plate 12 with the sidewall 18 being closely adjacent to the inside of the sidewall 16 of the top plate 12. Therefore, the opening 20 between the top plate 12 and the bottom plate 14, which leads to a compartment 22 formed between the top plate 12 and the bottom plate 14, is directed downwardly. The close fitting downwardly directed opening 20 minimizes the sealing area between the plates 12 and 14 as well as inhibits the entrance of environmental agents into the compartment 22.

Referring now to FIGS. 1 and 3, a plurality of pockets or recesses 24, here shown for example as sixteen recesses 24, are molded in either the top or the bottom plate 14 and preferably, as shown, molded in the bottom of the top plate 12 for receiving conventional solar cells, such as solar silicon photo-voltaic cells of the P on N type or N on P type. Preferably, the recesses 24 are sized and shaped, here shown as circular, to conform with the size and shape of the solar cells 26 which they receive. In addition, a passageway 28 is provided from each recess 24 to at least one adjacent recess 24 for accommodating electrical connections 25 between adjacent solar cells 26 in the recesses 24. Preferably, as best seen in FIG. 1, the recesses 24 are positioned in both longitudinal and transverse rows with a passageway 28 from each recess 24 extending both longitudinally and transversely thereby allowing the cells 26 to be connected either in series or in parallel as desired. Any suitable potting compound 27, which has an index of refraction similar to the index or refraction of glass, fills the compartment 22 (FIGS. 4–6). One suitable type of potting compound is a room temperature vulcanized rubber silicon product such as sold by Dow Corning under the trademark "Sealgard". In the past, potting compounds have caused problems in solar panels since they generally have a thermal expansion greater than the thermal expansion of the panels and sometimes cause cracking and breaking of the solar panels. In the present device, the recesses 24 minimize the thickness and volume of the compartment 22 thereby reducing the thickness and volume of potting compound required which reduces the problem of thermal expansion of the potting compound 27. Other advantages of the recesses 24 are that they provide a uniform thickness of potting compound 27 resulting in more uniform stresses, reduce the volume of potting compound 27 required with consequent cost savings, float the cells 26 in the recesses 24 that reduces point contact stresses. Preferably, both the bottom 30 of the top plate 16 and the top 32 of the bottom plate 14 are texturized or roughened such as by chemical etching or mechanical roughing. Texturized surfaces 30 and 32 are therefore cleaned and increase the adhesion of the potting compound 27 by increasing its effective bonding area. Also, the recess 24 allow a reduced thickness of the compartment 22 which improves bonding of the top plate 12 to the bottom plate 14.

However, the thickness of the compartment 22 should be sufficient so as to maintain the elasticity of the potting compound 27. That is, the potting compound 27 expands and contracts with variations in environmental temperatures and extremely thin sections of potting compound 27 tend to pull apart when subjected to thermal cycling. Therefore, spacers such as hemispheres 29 (shown in FIGS. 1 and 5, but not in FIGS. 3 and 4 because of the scale of the Figures) are molded to one of the top plate 12 or the bottom plate 14, here shown as to the top plate 12 to maintain the thickness of the compartment 22 above a predetermined minimum. For example, the height of the spacers 29 in one embodiment is 20 mils thereby maintaining the thickness of the compartment 22 at 20 mils. Preferably, the thickness of the recesses 24 is 20 mils and the thickness of the solar cells is 14 mils. Therefore, in addition to providing a minimum thickness for the compartment 22 and the potting compound 27, it is to be noted that the thickness of the potting compound 27 throughout the compartment 22 is similar which assists the potting compound 27 to withstand thermal cycling.

Electrical connections are provided to the solar cells which sealably extend through the bottom plate 14. Referring to FIGS. 1, 2, 4 and 5, an opening 34 is molded in the bottom plate 14 and a recess 36 is molded into the top plate 12. A stud bolt 38 is positioned with its head 40 in the opening 36 and extends through the opening 34 in the bottom plate 14. A lug 42 is soldered to the stud 38 and is positioned in a path 44 molded in the stop plate 12 to provide a slack connector which is connected to a solar cell and permits strain relief which is desirable because of the fragile nature of the solar cells 26. Preferably, the path 44 is of an extended length and is filled with a suitable sealing compound for preventing the entrance of foreign agents into the interior of the compartment 22. An electrical terminal 45 is threadably attached to the stud 38 against an O-ring 46. Thus, the downwardly directed electrical connections provide mechanically strong and weatherproof terminals for connection to an external electrical connection 48 by means of a threaded screw 50 to the terminal 45.

It is preferred that the recesses 24 be in the bottom 30 of the top plate 12 for ease in assembling the solar panel 10. This allows the top plate 12 to be placed downwardly with the bottom 30 directed upwardly. The electrically connected cells 26 are placed in potting compound 27 filling recesses 24, and the bottom plate 14 is inserted into the bottom of the top plate 12. Sealing around the opening 20 between the top plate 12 and the bottom plate 14 may be accomplished by filling the compartment 22 completely with potting compound 27 so that it will overflow through the opening 20 and form a seal therein. However, the opening 20 can be sealed by other material such as epoxy glues or the opening 20 may be sealed by fusing the sidewalls 16 and 18 together.

The present invention, therefore, is well adapted to carry out the objects and attain the ends and advantages mentioned as well as others inherent therein. While a presently preferred embodiment of the invention is given for the purpose of disclosure, numerous changes in the details of construction will readily suggest themselves to those skilled in the art and which are encompassed within the spirit of the invention and the scope of the appended claims.

What is claimed is:

1. An enclosure for receiving a plurality of solar cells comprising,
   a top molded glass plate having a downwardly directed sidewall extending around the outer periphery,
   a bottom molded glass plate having a downwardly directed sidewall extending around the outer periphery, said bottom plate adapted to be positioned beneath and within the sidewall of the top plate with the sidewall of the bottom plate being closely adjacent the inside of the sidewall of the top plate for providing a downwardly directed opening to the compartment formed between the top and bottom plates,
   a plurality of recesses molded in one of the bottom of the top plate or the top of the bottom plate for receiving solar cells whereby the thickness of the compartment is minimized, said recesses sized and shaped to conform to the size and shape of the solar cells,
   a passageway from each recess to an adjacent recess for accommodating electrical connections between solar cells, and
   electrical connections extending from the compartment through the bottom plate.

2. The apparatus of claim 1 including
   a plurality of spacers positioned between the top plate and the bottom plate for maintaining the thickness of the compartment above a predetermined minimum.

3. The apparatus of claim 1 wherein the recesses are provided in a plurality of longitudinally and transversely extending rows, and passageways extend from each recess longitudinally and transversely for connecting solar cells therein in parallel or in series.

4. A solar cell panel comprising,
   a top molded glass plate having a downwardly directed sidewall extending around the outer periphery,
   a bottom molded glass plate positioned beneath and within the downwardly directed sidewall of the top plate with the outer periphery of the bottom plate being closely adjacent the inside of the sidewall of the top plate for providing a downwardly directed opening to the compartment formed between the top and bottom plates,
   a plurality of recesses molded in the bottom of the top plate or the top of the bottom plate for receiving solar cells whereby the thickness of the compartment is minimized,
   a solar cell positioned in each of the plurality of recesses,
   potting compound having an index of refraction similar to the index of refraction of glass filling the compartment, and
   electrical connections to said solar cells sealably extending through the bottom plate.

5. The apparatus of claim 4 wherein the recesses are sized and shaped to conform to the size and shape of the solar cells.

6. The apparatus of claim 4 including,
   a plurality of spacers positioned between the top plate and the bottom plate for maintaining the thickness of the compartment above a predetermined minimum whereby the potting compound may withstand thermal cycling.

7. The apparatus of claim 4 wherein the interiors of the top plate and the bottom plate are texturized surfaces providing an increased adhesion of the potting compound thereto.

8. The apparatus of claim 4 wherein the recesses are formed in the bottom of the top plate.

9. The apparatus of claim 4 including,
   a passageway from each recess to an adjacent recess for accommodating electrical connections between adjacent solar cells.

10. The apparatus of claim 4 wherein the electrical connections include,
    an extended interior path leading to one of the recesses,
    a stud extending from the path through the bottom plate,
    a lug positioned in the path and connected to the study, said lug electrically connected to a solar cell, and
    a sealing material filling the path,
    an electrical terminal connected to the stud exteriorly of the bottom plate, and
    a sealing ring between the terminal and the bottom plate.

11. A solar cell panel comprising,
    a top molded glass plate having a downwardly directed sidewall extending around the outer periphery,
    a bottom molded glass plate having a downwardly directed sidewall extending around the outer periphery, said bottom plate positioned beneath and within the sidewall of the top plate with the sidewall of the bottom plate being closely adjacent the inside of the sidewall of the top plate for providing a downwardly directed opening to the compartment formed between the top and bottom plates,
    a plurality of recesses molded one of the bottom of the top plate or in the top of the bottom plate for receiving solar cells whereby the thickness of the compartment is minimized, said recesses sized and shaped to conform to the size and shape of the solar cells,
    a solar cell positioned in each of the recesses,
    a passageway from each recess to an adjacent recess for accommodating electrical connections between adjacent solar cells,
    potting compound having an index of refraction similar to the index of refraction of glass filling the compartment, and
    electrical connections to said solar cells sealably extending through the bottom plate.

12. The apparatus of claim 11 including,
    a plurality of spacers positioned between the top plate and the bottom plate for maintaining the thickness of the compartment above a predetermined minimum whereby the potting compound may withstand thermal coupling.

* * * * *

UNITED STATES PATENT OFFICE
CERTIFICATE OF CORRECTION

Patent No. 4,097,308  Dated June 27, 1978

Inventor(s) William R. Klein, Carl L. Kotila & Ira L. Krams

It is certified that error appears in the above-identified patent and that said Letters Patent are hereby corrected as shown below:

Column 2, line 4, delete "wtih" and insert --with--

Column 5, line 60, after "in" insert --one of--

Column 5, line 64, after the second occurrence of "of" insert --the--

Signed and Sealed this

Sixteenth Day of January 1979

[SEAL]

Attest:

RUTH C. MASON
Attesting Officer

DONALD W. BANNER
Commissioner of Patents and Trademarks